(12) United States Patent
Xiao et al.

(10) Patent No.: US 11,239,301 B2
(45) Date of Patent: Feb. 1, 2022

(54) DISPLAY ASSEMBLY, DISPLAY DEVICE AND MANUFACTURING PROCESS HAVING A SUPPORT PORTION IN THE NON-DISPLAY REGION OF THE SUBSTRATE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Ang Xiao, Beijing (CN); Qijun Liu, Beijing (CN); Shanshan Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 517 days.

(21) Appl. No.: 16/334,733

(22) PCT Filed: Sep. 26, 2018

(86) PCT No.: PCT/CN2018/107565
§ 371 (c)(1),
(2) Date: Mar. 19, 2019

(87) PCT Pub. No.: WO2019/148860
PCT Pub. Date: Aug. 8, 2019

(65) Prior Publication Data
US 2021/0335972 A1    Oct. 28, 2021

(30) Foreign Application Priority Data
Feb. 5, 2018  (CN) .......................... 201810113715.6

(51) Int. Cl.
*H01L 51/00* (2006.01)
*H01L 51/52* (2006.01)
(Continued)

(52) U.S. Cl.
CPC ...... *H01L 27/3276* (2013.01); *H01L 51/0097* (2013.01); *H01L 51/5253* (2013.01);
(Continued)

(58) Field of Classification Search
CPC ............. H01L 23/4985; H01L 23/5387; H01L 23/5389; H01L 51/0097; H01L 51/5253;
(Continued)

(56) References Cited

U.S. PATENT DOCUMENTS

2014/0367659 A1* 12/2014 Cho ............... H01L 27/3276
                                                     257/40
2015/0048349 A1  2/2015 Kawata et al.
(Continued)

FOREIGN PATENT DOCUMENTS

CN    103872089 A    6/2014
CN    105609532 A    5/2016
(Continued)

OTHER PUBLICATIONS

Second Chinese Office Action dated Aug. 20, 2020, received for corresponding Chinese Application No. 201810113715.6, 12 pages.
(Continued)

*Primary Examiner* — Hoai V Pham
(74) *Attorney, Agent, or Firm* — Kinney & Lange, P.A.

(57) ABSTRACT

The present disclosure provides a display assembly, a display device, and a manufacturing process. The display assembly includes: a substrate; a display element arranged in a display region of the substrate; a package film covering the display element; a driving circuit arranged in a non-display region of the substrate; a chip-on-film bonded with the
(Continued)

driving circuit; and a support portion arranged in the non-display region of the substrate and outside the package film.

20 Claims, 1 Drawing Sheet

(51) Int. Cl.
*H01L 27/32* (2006.01)
*H01L 51/56* (2006.01)

(52) U.S. Cl.
CPC ........ *H01L 51/56* (2013.01); *H01L 2227/323* (2013.01); *H01L 2251/5338* (2013.01)

(58) Field of Classification Search
CPC ............... H01L 51/56; H01L 2227/323; H01L 2251/5338
USPC .................................. 438/106, 121; 257/680
See application file for complete search history.

(56) References Cited

U.S. PATENT DOCUMENTS

| | | |
|---|---|---|
| 2016/0276618 A1 | 9/2016 | Sun et al. |
| 2017/0179429 A1 | 6/2017 | Jin et al. |

FOREIGN PATENT DOCUMENTS

| | | |
|---|---|---|
| CN | 105957830 A | 9/2016 |
| CN | 107203296 A | 9/2017 |
| CN | 108281472 A | 7/2018 |
| WO | WO 2008009929 A2 | 1/2008 |

OTHER PUBLICATIONS

First Chinese Office Action dated Feb. 25, 2020, received for corresponding Chinese Application No. 201810113715.6, 13 pages.
International Search Report and Written Opinion for International Application No. PCT/CN2018/107565, dated Dec. 6, 2018, 12 pages.

* cited by examiner

DISPLAY ASSEMBLY, DISPLAY DEVICE AND MANUFACTURING PROCESS HAVING A SUPPORT PORTION IN THE NON-DISPLAY REGION OF THE SUBSTRATE

CROSS-REFERENCE TO RELATED APPLICATION

This application is the U.S. national phase of PCT Application No. PCT/CN2018/107565 filed on Sep. 26, 2018, which claims a priority to Chinese Patent Application No. 201810113715.6 filed on Feb. 5, 2018, the disclosures of which are incorporated in their entirety by reference herein.

TECHNICAL FIELD

The present disclosure relates to the field of manufacturing displays, in particular to a display assembly, a display device, and a manufacturing process.

BACKGROUND

At present, some displays (such as flexible displays) arrange a display element, a driver IC and a driving circuit (generally referred to as a flexible printed circuit PAD) on a same substrate, and the display element is sealed by a package film to prevent oxidation from the outside.

In the manufacturing process of such display, after a display element, a package film and a driving circuit are manufactured on the substrate, it is necessary to press the chip-on-film bonded with the driving IC onto a driving circuit. In the pressing process, the chip-on-film may be into contact with the package film, leading to a squeeze toward the package film, thereby causing a structural damage. The external water and oxygen enters the inside of the package film through the structural damage and oxidize the display element, thereby affecting the service life of the flexible display.

SUMMARY

In one aspect, an embodiment of the present disclosure provides a display assembly, including:

a substrate;

a display element arranged in a display region of the substrate;

a package film covering the display element; a driving circuit arranged in a non-display region of the substrate; a chip-on-film bonded with the driving circuit; and a support portion arranged in the non-display region of the substrate and outside the package film.

Optionally, an orthogonal projection of the chip-on-film on the substrate comprises an overlapping region with an orthogonal projection of the package film on the substrate, and in a direction perpendicular to the substrate, a height of the support portion on the substrate is greater than a maximum height of the package film on the substrate in the overlapping region.

Optionally, the support portion is arranged at least on a side of the driving circuit proximate to the package film.

Optionally, the support portion is of a columnar structure.

Optionally, the support portion has a top surface away from the substrate, and the top surface is in contact with the chip-on-film.

Optionally, the number of the support portions is more than one, and at least parts of the support portions are uniformly distributed outside the package film.

Optionally, in a direction perpendicular to the substrate, a height of the support portion on the substrate is greater than a height of the driving circuit on the substrate.

Optionally, a material for forming the support portion includes an elastic material.

Optionally, the elastic material is polymethyl methacrylate or a photoresist.

Optionally, the display element is an Organic Light-Emitting Diode (OLED) display element.

Optionally, the substrate is a flexible substrate.

In another aspect, an embodiment of the present further provides a display device including the above display assembly provided by the present disclosure.

Optionally, the display device is a mobile phone, a tablet computer, or an e-reader.

In addition, an embodiment of the present disclosure further provides a process for manufacturing a display assembly, includes:

providing a substrate;

arranging a display element in a display region of the substrate;

arranging a package film covering the display element;

arranging a driving circuit in a non-display region of the substrate;

arranging a chip-on-film bonded with the driving circuit; and arranging a support portion in the non-display region of the substrate and outside corresponding region of the package film.

Optionally, the arranging the support portion in the non-display region of the substrate and outside the package film includes:

depositing a polymethyl methacrylate material in the non-display region of the substrate and outside the package film through an inkjet printing process to obtain the support portion formed of the polymethyl methacrylate material.

DETAILED DESCRIPTION

The technical problems to be solved, the technical solutions, and the advantages of the present invention will be more clearly described in combination with the drawings and specific embodiments. In the following description, specific details such as specific configurations and components are merely provided to assist in a comprehensive understanding of the embodiments of the present disclosure. Therefore, it will be apparent to a person skilled in the art that various improvements and modifications may be made to the embodiments described herein without departing from the principle and spirit of the present disclosure. In addition, for clarity and conciseness, descriptions of known functions and constructions are omitted.

It should be understood, "one embodiment" or "an embodiment" referred throughout the specification means that particular features, structures, or characteristics related to the example are included in at least one example of the present disclosure. Thus, "in one embodiment" or "in an embodiment" recited throughout the specification does not necessarily refer to the same embodiment. In addition, these particular features, structures, or characteristics may be combined in any suitable manner in one or more examples.

The present disclosure provides a solution to solve the problem that the chip-on-film in the conventional display assembly is easy to squeeze the package film to cause damage to the package film.

Figure 1:
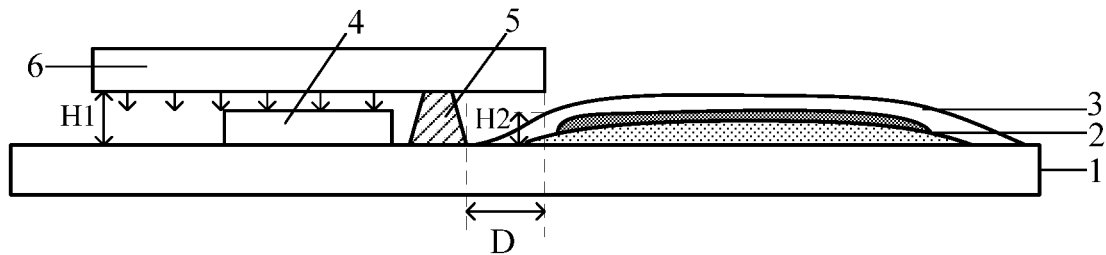
FIG. 1 is a schematic diagram of a display assembly according to an embodiment of the present disclosure.

In one aspect, an embodiment of the present disclosure provide a display assembly that can include only one single display substrate, as shown in FIG. 1, or a display panel that includes a cell alignment. As shown in FIG. 1, the display assembly includes:

substrate 1;

a display element 2 arranged in a display region of the substrate 1, in which the display element is a component of prior art, and if it is applied in an OLED of a display device, it is an OLED display element;

a package film 3 covering the display element;

a driving circuit 4 arranged in the non-display region of the substrate 1, and a chip-on-film 6 bonded with the driving circuit 4; and a support portion 5 arranged on a non-display region of the substrate 1 and outside the package film 3. The support portion 5 is configured to prevent the chip-on-film 6 from squeezing the package film 3. The support portion 5 may be either located against the chip-on-film 6 when the chip-on-film 6 is not squeezed to the package film 3, or separated from the chip-on-film 6 by a certain distance when the chip-on-film 6 is not squeezed to the package film 3, but only located against the chip-on-film when the chip-on-film 6 squeezes the package film 3.

The solution of the embodiment arranges a support portion outside the package film 3 for preventing the chip-on-film 6 from squeezing the package film 3, in which the support portion can effectively reduce the probability of damage of the package film 3, thereby ensuring the sealing performance of the display element 2. In view of this, the solution of the embodiment can significantly improve the yield of the display assembly, and thus has a high practical value.

Specifically, the support portion 5 of the embodiment may be formed of an elastic material, such that when the chip-on-film 6 squeezes the package film 3, the support portion 5 is deformed to a certain extent to provide a buffering effect.

As an exemplary introduction, in practical applications, it is found through repeated practices that the support portion 5 of the embodiment is made of, for example, polymethyl methacrylate. The polymethyl methacrylate has good insulation and mechanical strength. Its impact resistance is 200 times greater than the glass product, and there is almost no risk of damage, so that the package film 3 has a very obvious protective effect.

In addition, an orthogonal projection of the chip-on-film 6 on the substrate 1 and an orthogonal projection of the package film 3 on the substrate 1 may share an overlapping region D. In order to ensure an effective support of the chip-on-film 6 by the support portion 5, in a direction perpendicular to the substrate 1, a height H1 of the support portion 5 on the substrate 1 is greater than a maximum height H2 of the package film 3 on the substrate 1 in the overlapping region D.

Based on the above structural design, only after the support portion 5 is squeezed and deformed, can the chip-on-film 6 be in contact with the package film 3, and the support portion 5 can provide a more effective protection for the package film 3.

Further, in order to ensure the stability of the structure, the support portion 5 of the embodiment is, for example, of a columnar structure, and the top surface of the columnar structure is in contact with the chip-on-film 6 to provide good support performance.

In addition, the number of the support portions 5 may be more than one, and at least parts of the support portions 5 are uniformly distributed outside the package film 3, thereby providing a uniform support to the chip-on-film 6.

In practical applications, the support portions 5 of the embodiment may be arranged only on a side of the driving circuit 4 proximate to the package film 3; or parts of the support portions 5 may be arranged on a side of the driving circuit 4 proximate to the package film 3, and the other support portions 5 are arranged on the side of the driving circuit 4 away from the package film 3.

However, as a better solution, in order to ensure the protective effect of the support portions 5 on the package film 3, the support portions 5 of the embodiment are arranged at least on a side of the driving circuit 4 proximate to the package film 3, thereby supporting the chip-on-film 6 at a position proximate to the package film 3.

It can be seen that the solution of the embodiment is particularly suitable for use as a display assembly of a flexible display device, that is, the above substrate of the embodiment is a flexible substrate. In a practical application, the flexible substrate of the flexible display device is often bent by the user. Thus, the support portion 5 of the embodiment can during the bending of the flexible substrate provide support for the chip-on-film 6 to prevent the chip-on-film 6 from squeezing toward the package film 3, leading to the damage to the package film 3.

Obviously, based on the design of the embodiment, it has high practical value for the user that the service life of the flexible display device is greatly improved.

The above is an exemplary description for the display assembly of the embodiment, and is not intended to limit the scope of the disclosure. Various improvements and modifications can be made without departing from the principles of the present disclosure. For example, the shape of the support portion 5 of the embodiment may also be a cylinder or a trapezoidal body, and the top surface of the cylinder or the trapezoidal body directly faces the chip-on-film 6, thereby providing a more stable supporting effect. Again, for example, this embodiment does not limit the material for forming the support portion 5. The above polymethyl methacrylate is merely one embodiment, and other embodiment for the support portion 5 may be formed of a photoresist.

In another aspect, another embodiment of the present disclosure further provides a display device including the display assembly provided by the above embodiments of the present disclosure.

Based on the display assembly, the package film of the display device of the embodiment is not easily damaged, which can provide a better sealing protection for the display element, and can prevent the display element from being oxidized and thus affecting the normal display of the screen.

In a practical application, the display device of the embodiment may be a display product provided with a display screen, such as a mobile phone, a tablet computer, and an e-reader.

The solution of the embodiment is particularly suitable for a flexible display device. The flexible display device is often bent due to the use requirement. During the bending, the chip-on-film often squeezes the package film, while the support portion of the embodiment can prevent the chip-on-film from squeezing the package film, thereby reducing the probability of damage to the package film.

In addition, another embodiment of the present disclosure further provides a process for manufacturing a display assembly, includes:

providing a substrate;

arranging a display element in a display region of the substrate;

arranging a package film covering the display element;

arranging a driving circuit in a non-display region of the substrate; and arranging a chip-on-film bonded with the driving circuit; and arranging a support portion in the non-display region of the substrate and outside the package film, in which the support portion is configured to prevent the chip-on-film from squeezing the package film.

Obviously, based on the manufacturing process of the present disclosure, the manufacturing process of the display device of the embodiment can prevent the chip-on-film from damaging the package film during the binding of the driving circuit, thereby preventing the display element from being oxidized by the external environment. Thus, the manufactured display device has a relatively high yield and a relatively long service life.

The manufacturing process of the embodiment will be described exemplarily in the following with reference to the implementation.

Figure 2:
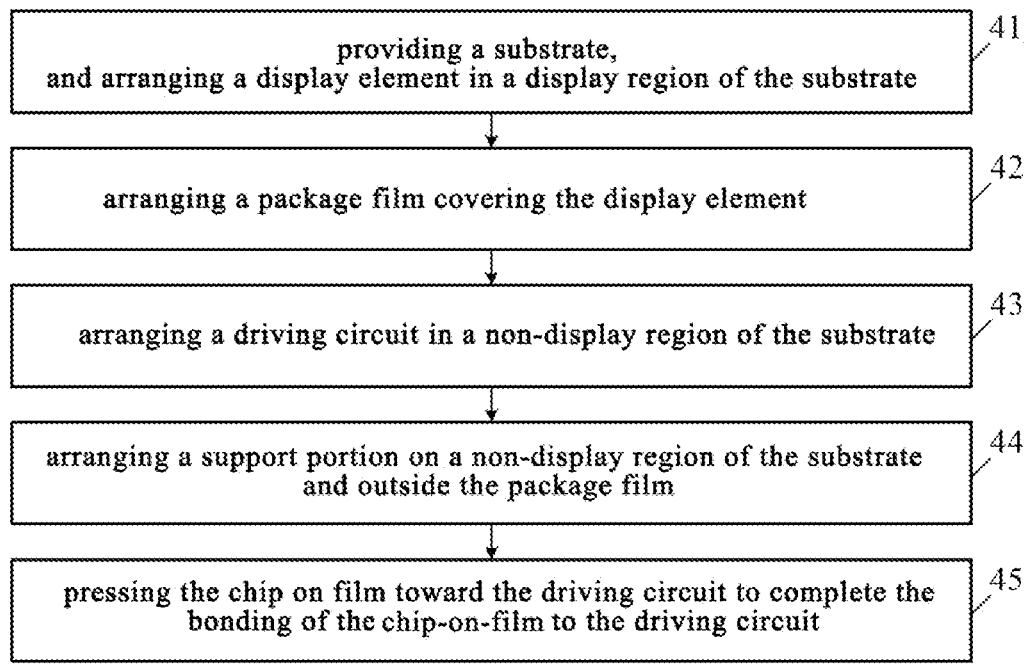
FIG. 2 is a schematic diagram of steps of a process for manufacturing a display assembly according to an embodiment of the present disclosure.
Figure 3:
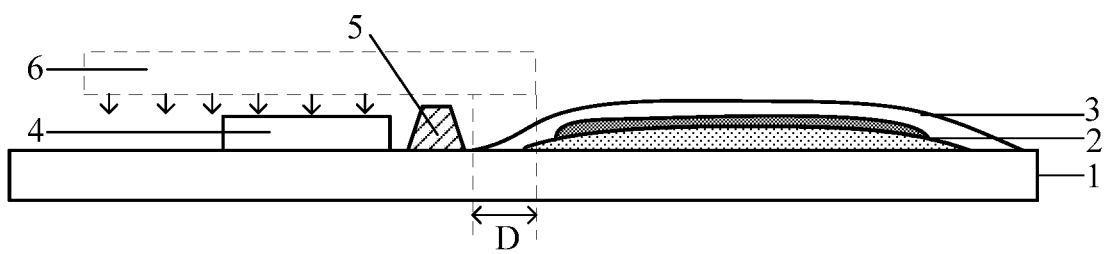
FIG. 3 is a schematic diagram of operation of a process for manufacturing a display assembly according to an embodiment of the present disclosure.

As shown in FIG. 2 and FIG. 3, the manufacturing process of the embodiment includes the following steps:

Step 41: providing a substrate 1, and arranging the display element 2 in the display region of the substrate 1, Optionally, the above substrate 1 may be a flexible substrate, and the above display element 2 may be an OLED display element;

Step 42: arranging a package film 3 covering the display element 2;

Step 43: arranging a driving circuit 4 in a non-display region of the substrate 1;

Step 44: forming a support portion 5 on a non-display region of the substrate 1 and outside the package film 3; and Step 45: pressing the chip-on-film 6 toward the driving circuit 4 to complete the bonding of the chip-on-film 6 to the driving circuit 4.

In step 44, an inkjet printing process can be specifically used for depositing a polymethyl methacrylate material in a non-display region outside the package film, to obtain a support portion 5 formed of the polymethyl methacrylate material.

The polymethyl methacrylate material is suitable for the inkjet printing process, and the masking process is not required in the manufacturing process. Therefore, the manufacturing process of the support portion of the embodiment is simple and the manufacturing cost is low, and thus is very practical. In addition, the thickness of the package film on the display assembly is generally about 700 Å, while the thickness of the support portion supported through the inkjet printing process is greater than that value, that is, the height of the manufactured support portion 5 on the substrate 1 is directly greater than the height of the package film 3 on the substrate 1.

In addition, after the completion of the above step 44, the height of the formed support portion 5 on the substrate 1 (in the direction perpendicular to the substrate 1) may be greater than the height of the driving circuit 4 on the substrate 1 (in the direction perpendicular to the substrate 1), so as to provide a better support.

In step 45, specifically, an orthogonal projection of the chip-on-film 6 on the substrate 1 and an orthogonal projection of the package film 3 on the substrate 1 share an overlapping region. During the pressing of the chip-on-film 6 toward the driving circuit 4, the chip-on-film 6 first comes into contact with the support portion 5, and after the support portion 5 is deformed, it comes into contact with the driving circuit to complete the bonding. That is, before the chip-on-film 6 comes into contact with the driving circuit 4, the support portion 5 provides a buffering power to the chip-on-film 6 to prevent the chip-on-film 6 from being pressed, and leads to a relatively severe squeeze to the package film 3 of the overlapping region.

Obviously, the manufacturing process of the embodiment is used to manufacture the display assembly provided by the present disclosure, and thus the technical effect of the display assembly may also be achieved by the manufacturing process of the embodiment.

The above solution of the present disclosure has the following beneficial effects:

The solution of the present disclosure arranges a support portion outside the package film for preventing the chip-on-film from squeezing the package film, in which the support portion can effectively reduce the probability of damage to the package film, thereby ensuring the sealing performance of the display element. In view of this, the solution of the present disclosure can significantly improve the yield of the display assembly, and thus has a high practical value.

The above descriptions are embodiments listed in the present disclosure. It should be noted that one skilled in the art would make several improvements and substitutions without departing from the principles of the present disclosure. These improvements and modifications should also be regarded as the protection scope of the present disclosure.

Unless otherwise defined, technical terms or scientific terms used herein have the normal meaning commonly understood by one skilled in the art in the field of the present disclosure. The "including" used herein and the like used in the present disclosure means that the element or item appeared in front of the word encompasses the element or item and their equivalents listed after the word, and does exclude other elements or items.

What is claimed is:

1. A display assembly comprising:
   a substrate;
   a display element arranged in a display region of the substrate;
   a package film covering the display element;
   a driving circuit arranged in a non-display region of the substrate;
   a chip-on-film bonded with the driving circuit; and
   a support portion arranged in the non-display region of the substrate and outside the package film.

2. The display assembly of claim 1, wherein
   an orthogonal projection of the chip-on-film on the substrate comprises an overlapping region with an orthogonal projection of the package film on the substrate, and in a direction perpendicular to the substrate, a height of the support portion on the substrate is greater than a maximum height of the package film on the substrate in the overlapping region.

3. The display assembly of claim 1, wherein
the support portion is arranged at least on a side of the driving circuit proximate to the package film.

4. The display assembly of claim 1, wherein
the support portion is of a columnar structure.

5. The display assembly of claim 1, wherein
the support portion has a top surface away from the substrate, and the top surface is in contact with the chip-on-film.

6. The display assembly of claim 1, wherein the number of the support portions is more than one, and at least parts of the support portions are uniformly distributed outside the package film.

7. The display assembly of claim 1, wherein in a direction perpendicular to the substrate, a height of the support portion on the substrate is greater than a height of the driving circuit on the substrate.

8. The display assembly of claim 1, wherein
a material for forming the support portion comprises an elastic material.

9. The display assembly of claim 8, wherein
the elastic material is polymethyl methacrylate or a photoresist.

10. The display assembly of claim 1, wherein
the display element is an Organic Light-Emitting Diode (OLED) display element.

11. The display assembly of claim 1, wherein
the substrate is a flexible substrate.

12. A display device comprising the display assembly of claim 1.

13. The display device of claim 12, wherein the display device is a mobile phone, a tablet computer, or an e-reader.

14. The display device of claim 12, wherein
an orthogonal projection of the chip-on-film on the substrate comprises an overlapping region with an orthogonal projection of the package film on the substrate, and in a direction perpendicular to the substrate, a height of the support portion on the substrate is greater than a maximum height of the package film on the substrate in the overlapping region.

15. The display device of claim 12, wherein
the support portion is arranged at least on a side of the driving circuit proximate to the package film.

16. A process for manufacturing a display assembly, comprising:
providing a substrate;
arranging a display element in a display region of the substrate;
arranging an package film covering the display element;
arranging a driving circuit in a non-display region of the substrate;
arranging a chip-on-film bonded with the driving circuit; and
arranging a support portion in the non-display region of the substrate and outside the package film.

17. The process of claim 16, wherein
the arranging the support portion in the non-display region of the substrate and outside the package film comprises:
depositing a polymethyl methacrylate material in the non-display region of the substrate and outside the package film through an inkjet printing process to obtain the support portion formed of the polymethyl methacrylate material.

18. The process of claim 16, wherein
an orthogonal projection of the chip-on-film on the substrate comprises an overlapping region with an orthogonal projection of the package film on the substrate, and in a direction perpendicular to the substrate, a height of the support portion on the substrate is greater than a maximum height of the package film on the substrate in the overlapping region.

19. The process of claim 16, wherein the support portion is arranged at least on a side of the driving circuit proximate to the package film.

20. The process of claim 16, wherein the support portion is of a columnar structure.

* * * * *